United States Patent [19]
Gaumont-Goarin et al.

[11] Patent Number: 5,646,064
[45] Date of Patent: Jul. 8, 1997

[54] METHOD OF FABRICATING A SEGMENTED MONOCRYSTALLINE CHIP

[75] Inventors: Elisabeth Gaumont-Goarin, Montrouge; Christine Labourie, Villejuif; Jean-Yves Emery, Paris, all of France

[73] Assignee: Alcatel N.V., Rijswijk

[21] Appl. No.: 375,982

[22] Filed: Jan. 20, 1995

[30] Foreign Application Priority Data

Jan. 21, 1994 [FR] France ............... 94 00636

[51] Int. Cl.⁶ ................................... H01L 21/20
[52] U.S. Cl. .............. 437/133; 437/126; 437/129; 437/228; 216/72; 216/95; 156/650; 156/652
[58] Field of Search ........................ 437/126, 129, 437/133, 228; 216/72, 95; 156/650, 651, 652

[56] References Cited

U.S. PATENT DOCUMENTS

| | | | |
|---|---|---|---|
| 4,820,655 | 4/1989 | Noda et al. | |
| 5,237,639 | 8/1993 | Kato et al. | 437/129 |
| 5,316,967 | 5/1994 | Kaneno et al. | 437/126 |
| 5,511,089 | 4/1996 | Yamada | 372/45 |
| 5,539,763 | 7/1996 | Takemi et al. | 372/50 |

FOREIGN PATENT DOCUMENTS

0261943A1  3/1988  European Pat. Off.
2275364    8/1994  United Kingdom.

OTHER PUBLICATIONS

*Patent Abstracts of Japan*, vol. 16, No. 492 (E–1278) 12 Oct. 1992 & JP-A-04 180 687 (NEC Corp) 26 Jun. 1992.
*Patent Abstracts of Japan*, vol. 13, No. 86 (E–720) 28 Feb. 1989 & JP-A-63 263 726 (Matsushita Electric IInd Co. Ltd) 31 Oct. 1988.
French Search Report FR 9400636.
*Patent Abstracts of Japan*, vol. 14, No. 308 (E–947) 3 Jul. 1990 & JP-A-02 100 387 (The Furukawa Electric Co., Ltd) 12 Apr. 1990.

*Primary Examiner*—Tuan H. Nguyen
*Attorney, Agent, or Firm*—Sughrue, Mion, Zinn, Macpeak & Seas

[57] ABSTRACT

A portion of the surface of the first structure is protected by an oxide deposit, and the non-protective layers are etched down to a stop layer. The layers in the etched zone are then built up by molecular beam epitaxy, and one of the built-up layers is given a composition that is different from the composition of the corresponding adjacent layer in the first structure. The method is applicable to fabricating an integrated semiconductor comprising both a laser and a modulator.

6 Claims, 1 Drawing Sheet

METHOD OF FABRICATING A SEGMENTED MONOCRYSTALLINE CHIP

The present invention relates to a method of fabricating a segmented monocrystalline chip, in particular a semiconductor chip that guides light and applies a plurality of treatments to light. Two such treatments comprise creating laser light, and modulating said light.

BACKGROUND OF THE INVENTION

When fabricating a semiconductor laser having an incorporated modulator, it is necessary for two semiconductor structures including two light guiding layers of different compositions to be coupled together end to end. This forms two successive segments belonging to the same optical waveguide and respectively performing the two functions of creating and of modulating light.

Until now, such coupling has been performed by making a first semiconductor structure in both segments and then eliminating it by etching that is limited to one of the segments. The second semiconductor structure is then made adjacent to the first by epitaxial deposits.

In known methods, use is made either of wet etching by means of a liquid reagent, or else of dry etching by means of a reactive plasma or of a beam of reactive ions.

The performance of components fabricated by those known methods is not very reproducible.

OBJECTS AND SUMMARY OF THE INVENTION

Particular objects of the present invention are to obtain in simple manner performance that is better and more reproducible than before.

To these ends, the present invention provides a method of fabricating a segmented monocrystalline chip that is to include first and second structures respectively occupying first and second segments extending one after the other along a length direction of the chip, each structure being made up of superposed layers of different compositions, the two structures being formed on a common bottom layer that forms a portion of the chip, said method comprising the following steps:

the bottom layer is formed and the first structure is formed by epitaxial deposition on said bottom layer in both of said segments;

a protective deposit is formed on said structure in the first segment;

said first structure is etched so as to be eliminated down to said bottom layer in the second segment while being protected by the protective deposit in the first segment; and the second structure is formed by epitaxial deposition on the bottom layer;

wherein said etching of the first structure includes dry etching followed by final wet etching that reaches the bottom layer.

Preferably, the etching of the first structure includes firstly initial wet etching to undercut the first structure beneath an edge of the protective deposit, said fabrication of the second structure by deposition on the bottom layer being accompanied by parasitic deposition on the protective deposit, the method then including etching of said protective deposit from said undercut to remove both the protective deposit and the parasitic deposit.

Typically, each structure must include a guiding layer that has an increased refractive index. The guiding layers of the two structures must then be in alignment to guide the same light that is required to propagate longitudinally through the chip. Under such circumstances, the bottom layer is formed by epitaxial deposition on a base layer, the composition of the bottom layer being such that said layer constitutes a stop layer suitable for stopping said final wet etching, the guiding layers are formed a short distance above said stop layer.

Typically, the layers of the chip include both binary semiconductor layers constituted by two III-V type substances such as phosphorous and indium, and composite semiconductor layers constituted in part by the same two substances and in part by other substances that are compatible with crystal continuity, e.g. arsenic and gallium. The base layer is binary, the stop layer is composite, and each structure includes, starting from the stop layer:

a lower binary layer;

a composite guiding layer, the composite layers of the two structures being mutually different; and an upper binary layer; the protective deposit being constituted by an oxide or by a nitride.

Typically, the two structures respectively constitute the semiconductor portions of a laser and of a modulator for modulating the light from the laser, the base layer, stop layer, and lower binary layers constituting a lower optical confinement assembly for the guiding layers, the upper binary layers constituting upper optical confinement layers for the guiding layers.

In the context of the present invention, causes have been found that might explain the insufficiencies and irregularities in performance that are observed on components fabricated by known methods. These possible causes are the following:

Wet etching has been performed using a succession of successive liquid reagents, each reagent being adapted to a particular layer composition and selectively etching layers that have that composition. When a layer such as a guiding layer, e.g. a quaternary layer of the first structure, is etched by such a reagent to eliminate the layer in the second segment, then said layer is undercut, i.e. said layer is etched not only in the second segment, but also over a small adjacent portion of the first segment.

During deposition of the second structure, said undercut in the guiding layer impedes the provision of appropriate longitudinal continuity between the layers of the two structures. Unfortunately, particularly with the guiding layers, such longitudinal continuity is necessary to ensure good optical connection between the two structures.

Dry etching causes surface degradation of the crystal state of the bottom layer. During deposition of the second structure, such surface degradation impedes providing suitable vertical continuity between said structure and the bottom layer. Unfortunately, particularly with an electro-optical device such as a semiconductor laser, such vertical continuity is necessary to ensure good electrical connection for charge carriers moving under drive from a vertical electrical field.

By using an appropriate succession of dry etching and wet etching steps, the present invention makes it possible to achieve both the desirable vertical continuity over the entire length of the chip, and to achieve horizontal continuity between those of the layers in the two structures for which such continuity is necessary.

BRIEF DESCRIPTION OF THE DRAWING

The fabrication of two semiconductor structures of a semiconductor laser is described below by way of example and with reference to the diagrammatic figures of the accompanying drawing.

MORE DETAILED DESCRIPTION

Figure 1:
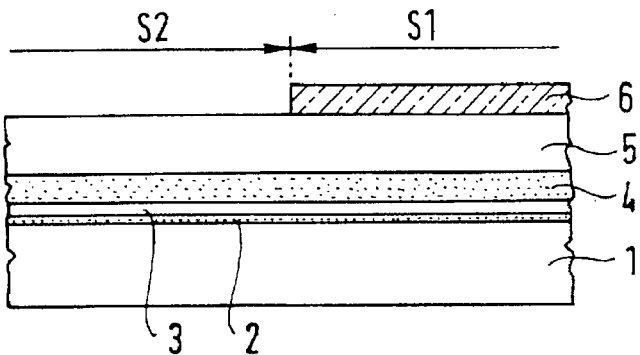
FIG. 1 shows a first semiconductor structure.

In FIG. 1, a binary base layer of the first semiconductor structure is disposed beneath a stop layer 2 of a material that may be quaternary for example (indium phosphide and gallium arsenide). Above the stop layer, the lower binary layer 3 of indium phosphide is surmounted by a guiding layer 4 which is quaternary for example, having an increased refractive index for the purpose of guiding light that is to be treated by a device that is to be fabricated, e.g. light that is to be both generated and modulated in a laser that includes an integrated modulator. The layer 4 is surmounted by a binary upper layer 5. In the first segment of the laser to be fabricated, the layer 5 is protected by a protective layer 6 of oxide or of nitride, e.g. of silica.

Figure 2:
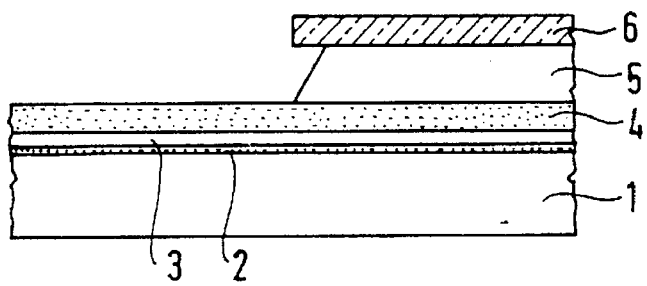
FIG. 2 shows the same structure after an upper binary layer of indium phosphide has been chemically etched by means of a liquid in a second segment which is shown on the left.

The structure constituted in this way is subjected to a first etching operation using a liquid chemical reagent that does not react with the oxide. The reagent etches that zone of the binary upper layer that is not protected by the oxide deposit. This etching is sufficient to undercut said layer beneath a rim of oxide deposit, as can be seen in FIG. 2.

Figure 3:
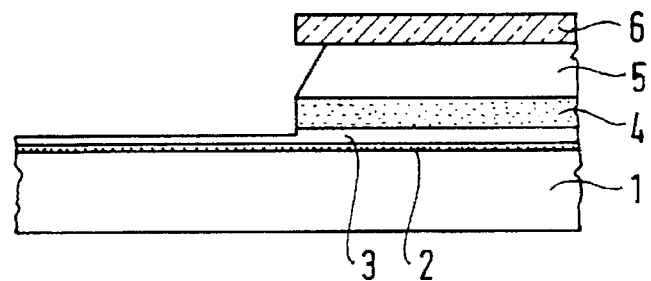
FIG. 3 shows the same structure after a quaternary guiding layer in the second segment has been etched by a reactive plasma.
Figure 4:
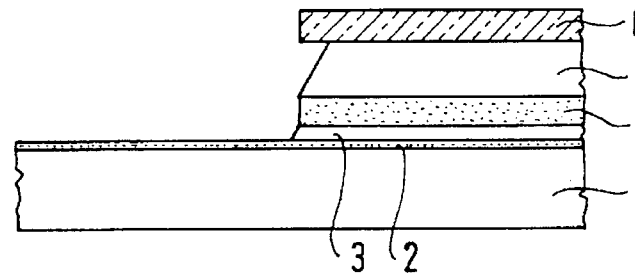
FIG. 4 shows the same structure after a lower binary layer of indium phosphide in the second segment has been chemically etched by means of a liquid.

Thereafter, in the same zone that is not protected by the oxide deposit, the quaternary layer 4 is removed by treatment with a reactive plasma so as to obtain the etched structure shown in FIG. 3.

Finally, weak chemical etching is performed to eliminate the lower binary layer 3. This etching stops at the quaternary layer 2.

Figure 5:
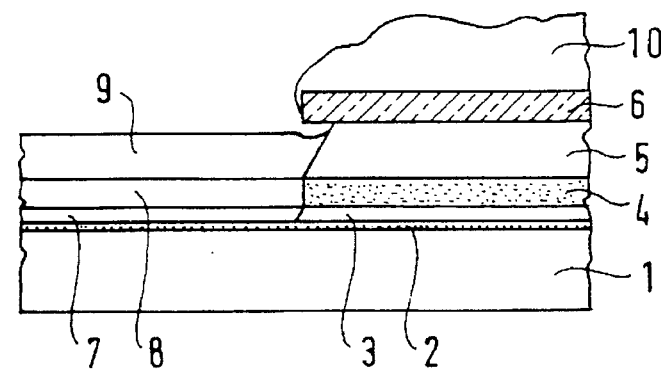
FIG. 5 shows a chip formed by depositing a second structure in the second segment, including a quaternary layer that differs in composition from the quaternary layer of the first structure.

Thereafter, the second structure of the laser is fabricated (to the left in FIG. 5), by using molecular beam epitaxy to deposit in succession: a lower binary layer 7; a guide layer 8 which is quaternary, for example; and an upper binary layer 9. The composition of the guiding layer 8 differs from that of the guiding layer 4, so as to provide the desired additional function. Because of the small thickness of the lower binary layer 3, it is possible to achieve mutual alignment between the layers 4 and 8 with good accuracy.

A polycrystalline deposit 10 builds up during the above processing on the protective oxide 6.

Finally, in a last operation, the protective oxide deposit 6 and the polycrystalline deposit 10 thereon are eliminated by chemical etching, with this elimination being facilitated by the undercut formed beneath the edge of the oxide deposit during the first chemical etching step.

We claim:

1. A method of fabricating a segmented monocrystalline chip that is to include first and second structures respectively occupying first and second segments extending one after the other along a length direction of the chip, each structure being made up of superposed layers of different compositions, the two structures being formed on a common bottom layer that forms a portion of the chip, said method comprising the following steps:

forming the bottom layer and the first structure by epitaxial deposition on said bottom layer in both of said segments;

forming a protective deposit on said structure in the first segment;

etching said first structure so as to be eliminated down to said bottom layer in the second segment while being protected by the protective deposit in the first segment; and after said first structure etching step, forming the second structure by epitaxial deposition on the bottom layer;

wherein said etching of the first structure includes dry etching followed by a step of final wet etching that reaches the bottom layer.

2. A method according to claim 1, wherein the etching of the first structure includes a step of firstly initial wet etching to undercut the first structure beneath an edge of the protective deposit, said fabrication of the second structure by deposition on the bottom layer being accompanied by parasitic deposition on the protective deposit, the method then including a step of etching of said protective deposit from said undercut to remove both the protective deposit and the parasitic deposit.

3. A method according to claim 1, wherein each of said structure includes a light guiding layer having an increased refractive index, the guiding layers of the two structures being in alignment to guide the same light propagating longitudinally through the chip, wherein said bottom layer is formed by epitaxial deposition on a base layer, the composition of the bottom layer being such that said layer constitutes a stop layer suitable for stopping said final wet etching, the guiding layers being formed at a distance above said stop layer.

4. A method according to claim 3, wherein said base layer is a binary semiconductor layer constituted by two III–V type substances, the stop layer is a composite semiconductor layer constituted in part by said two substances, and each of said structures comprise, from said stop layer:

a lower binary layer;

a composite guiding layer, the composite layers of the two structures being mutually different; and an upper binary layer;

the protective deposit being constituted by an oxide or a nitride.

5. A method according to claim 3, wherein said two structures each include a lower binary layer and an upper binary layer, and said two structures respectively constitute the semiconductor portions of a laser and of a modulator for modulating the light from the laser, and wherein said base layer, said stop layer, and said lower binary layers constitute a lower optical confinement assembly for said guiding layers, and said upper binary layers constitute upper optical confinement layers for said guiding layers.

6. A method according to claim 1, wherein said first etching step is performed so as to eliminate said first structure down to said bottom layer without etching said bottom layer.

* * * * *